(12) United States Patent
Roberge

(10) Patent No.: US 10,302,017 B2
(45) Date of Patent: May 28, 2019

(54) LIGHT WEIGHT COMPONENT WITH ACOUSTIC ATTENUATION AND METHOD OF MAKING

(71) Applicant: UNITED TECHNOLOGIES CORPORATION, Farmington, CT (US)

(72) Inventor: Gary D. Roberge, Tolland, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 337 days.

(21) Appl. No.: 15/096,619

(22) Filed: Apr. 12, 2016

(65) Prior Publication Data

US 2017/0292452 A1    Oct. 12, 2017

(51) Int. Cl.
*B23H 9/14* (2006.01)
*B32B 1/00* (2006.01)
(Continued)

(52) U.S. Cl.
CPC ............... *F02C 7/24* (2013.01); *B21D 22/02* (2013.01); *B23H 9/14* (2013.01); *B23K 26/36* (2013.01); *B32B 1/00* (2013.01); *B32B 3/26* (2013.01); *B32B 3/263* (2013.01); *B32B 3/266* (2013.01); *B32B 3/30* (2013.01); *B32B 5/00* (2013.01);
(Continued)

(58) Field of Classification Search
CPC . F02C 7/24; C23C 4/129; C23C 4/134; C23C 4/00; C23C 4/06; C23C 14/16; C23C 14/30; C23C 16/06; C23C 24/04; B21D 22/02; B23H 9/14; B23K 26/36; C25D 5/36; C25D 5/38; C25D 5/40; C25D 7/00; F02K 1/04; B23B 1/00; B23B 3/26; B23B 3/263; B23B 3/266; B23B 3/30; B23B 5/00; B23B 5/22; B23B 15/00; B23B 15/01; B23B 15/04; B23B 15/046; B23B 15/18; B23B 15/20; B23B 37/24; B23B 38/04

See application file for complete search history.

(56) References Cited

U.S. PATENT DOCUMENTS

| | | |
|---|---|---|
| 3,261,733 A | 7/1966 | Bellinger |
| 3,470,117 A | 9/1969 | Pearce |

(Continued)

FOREIGN PATENT DOCUMENTS

| | | |
|---|---|---|
| DE | 19526057 C1 | 4/1996 |
| DE | 202004018594 | 2/2005 |

(Continued)

OTHER PUBLICATIONS

JP 2004-360630 Machine Translation. 13 pages. Accessed EPO website Aug. 2, 2018.*

(Continued)

*Primary Examiner* — Richard A Edgar
(74) *Attorney, Agent, or Firm* — Cantor Colburn LLP

(57) ABSTRACT

A method of making a light weight component is provided. The method including the steps of: forming a metallic foam core into a desired configuration; applying an external metallic shell to an exterior surface of the metallic foam core after it has been formed into the desired configuration; and attenuating the component to a desired frequency by forming a plurality of openings in the external metallic shell.

20 Claims, 10 Drawing Sheets

(51) Int. Cl.
| | | |
|---|---|---|
| B32B 3/26 | (2006.01) | |
| B32B 3/30 | (2006.01) | |
| B32B 5/00 | (2006.01) | |
| B32B 5/22 | (2006.01) | |
| C23C 4/00 | (2016.01) | |
| C23C 4/06 | (2016.01) | |
| C25D 5/36 | (2006.01) | |
| C25D 5/38 | (2006.01) | |
| C25D 5/40 | (2006.01) | |
| C25D 7/00 | (2006.01) | |
| F02C 7/24 | (2006.01) | |
| F02K 1/04 | (2006.01) | |
| B21D 22/02 | (2006.01) | |
| B23K 26/36 | (2014.01) | |
| B32B 15/00 | (2006.01) | |
| B32B 15/01 | (2006.01) | |
| B32B 15/04 | (2006.01) | |
| B32B 15/18 | (2006.01) | |
| C23C 4/134 | (2016.01) | |
| C23C 4/129 | (2016.01) | |
| C23C 24/04 | (2006.01) | |
| C23C 14/16 | (2006.01) | |
| C23C 14/30 | (2006.01) | |
| C23C 16/06 | (2006.01) | |
| B32B 15/20 | (2006.01) | |
| B32B 37/24 | (2006.01) | |
| B32B 38/04 | (2006.01) | |

(52) U.S. Cl.
CPC ............... *B32B 5/22* (2013.01); *B32B 15/00* (2013.01); *B32B 15/01* (2013.01); *B32B 15/04* (2013.01); *B32B 15/046* (2013.01); *B32B 15/18* (2013.01); *B32B 15/20* (2013.01); *B32B 37/24* (2013.01); *B32B 38/04* (2013.01); *C23C 4/00* (2013.01); *C23C 4/06* (2013.01); *C23C 4/129* (2016.01); *C23C 4/134* (2016.01); *C23C 14/16* (2013.01); *C23C 14/30* (2013.01); *C23C 16/06* (2013.01); *C23C 24/04* (2013.01); *C25D 5/36* (2013.01); *C25D 5/38* (2013.01); *C25D 5/40* (2013.01); *C25D 7/00* (2013.01); *F02K 1/04* (2013.01); *B32B 2037/243* (2013.01); *B32B 2037/246* (2013.01); *B32B 2038/047* (2013.01); *B32B 2250/03* (2013.01); *B32B 2266/00* (2013.01); *B32B 2266/045* (2013.01); *B32B 2266/06* (2013.01); *B32B 2266/08* (2013.01); *B32B 2305/02* (2013.01); *B32B 2305/022* (2013.01); *B32B 2307/00* (2013.01); *B32B 2307/10* (2013.01); *B32B 2307/102* (2013.01); *B32B 2311/12* (2013.01); *B32B 2311/18* (2013.01); *B32B 2311/22* (2013.01); *B32B 2311/24* (2013.01); *B32B 2311/30* (2013.01); *B32B 2605/18* (2013.01); *F05D 2220/32* (2013.01); *F05D 2230/12* (2013.01); *F05D 2230/13* (2013.01); *F05D 2230/31* (2013.01); *F05D 2240/12* (2013.01); *F05D 2260/96* (2013.01)

(56) References Cited

U.S. PATENT DOCUMENTS

| | | | |
|---|---|---|---|
| 3,834,881 A | | 9/1974 | Niebylski |
| 4,042,746 A | | 8/1977 | Hofer |
| 5,112,663 A | | 5/1992 | Morenz et al. |
| 5,550,338 A | | 8/1996 | Hielscher |
| 5,594,216 A | * | 1/1997 | Yasukawa ............... F02C 7/045 181/213 |
| 6,436,480 B1 | | 8/2002 | Upadhya |
| 7,905,275 B2 | | 3/2011 | Behrens et al. |
| 8,887,864 B2 | * | 11/2014 | Sugimoto ............ B61D 17/185 181/284 |
| 2002/0121157 A1 | | 9/2002 | Knott et al. |
| 2004/0226702 A1 | | 11/2004 | Toonen et al. |
| 2005/0208361 A1 | | 9/2005 | Enjoji et al. |
| 2006/0060421 A1 | * | 3/2006 | Sarin ...................... F02K 1/827 181/290 |
| 2006/0285975 A1 | | 12/2006 | Landis |
| 2007/0003806 A1 | | 1/2007 | Sarkar et al. |
| 2007/0079507 A1 | | 4/2007 | Cheng et al. |
| 2009/0274924 A1 | | 11/2009 | Pelzer et al. |
| 2009/0308571 A1 | | 12/2009 | Thompson et al. |
| 2010/0331173 A1 | | 12/2010 | Ebener et al. |
| 2011/0065022 A1 | | 3/2011 | Min et al. |
| 2011/0297269 A1 | | 12/2011 | Pilon et al. |
| 2012/0152454 A1 | | 6/2012 | Mass et al. |
| 2012/0167572 A1 | * | 7/2012 | Rice ........................ F01D 9/02 60/751 |
| 2014/0007983 A1 | | 1/2014 | Prest et al. |
| 2014/0021645 A1 | | 1/2014 | Rayess et al. |
| 2014/0103613 A1 | | 4/2014 | Gomez |
| 2014/0169943 A1 | | 6/2014 | Bunker et al. |
| 2015/0118441 A1 | | 4/2015 | Shang et al. |
| 2015/0292818 A1 | | 10/2015 | Wilding et al. |
| 2015/0323263 A1 | | 11/2015 | Yanachi et al. |

FOREIGN PATENT DOCUMENTS

| | | | |
|---|---|---|---|
| DE | 102005004695 | | 9/2006 |
| DE | 102011078674 | | 1/2013 |
| EP | 0486427 | A1 | 5/1992 |
| EP | 1477578 | | 11/2004 |
| EP | 2019774 | A1 | 2/2009 |
| EP | 2716868 | A2 | 4/2014 |
| EP | 2811249 | A1 | 12/2014 |
| EP | 2921649 | A1 | 9/2015 |
| EP | 2977556 | A1 | 1/2016 |
| JP | 2004360630 | A * | 12/2004 |
| RU | 2592871 | C1 * | 7/2016 |
| WO | 9833621 | A1 | 8/1998 |
| WO | 2007073592 | A1 | 7/2007 |
| WO | 2007134626 | A1 | 11/2007 |
| WO | 2011010874 | A2 | 1/2011 |

OTHER PUBLICATIONS

RU 2,592,871 C1 Machine Translation. 5 pages. Accessed EPO website Aug. 2, 2018.*
Davies G. J. et al.: "Metallic Foam: Their Production, Properties and Applications", Journal of Materials Science, Kluwer Academic Publishers, vol. 18, No. 7.
European Search Report Application No. EP 17 16 6368.
European Search Report for Application No. EP 17 16 6349.
European Search Report for Application No. EP 17 16 6366.
European Search Report for Application No. EP 17 16 6371.
European Search Report for Application No. EP 17 16 6376.
European Search Report for EP Application No. 17 16 6220.
Partial EP Search Report for EP Application No. EP 17 16 6353.
No Author et al: "Stabilitat vereint Leichtigkeit AFS—Einstoff-Aluminium-Sandwich Metal Foam: Weltweit Einzigartig Stabilitat vereint Leichtigkeit AFS—Einstoff-Aluminium-Sandwich", Mar. 4, 2016.
European Search Report for Application No. EP 17 16 6353.
EP Office Action dated Jul. 30, 2018 for Application No. 17 166 220.8.
EP Office Action dated Sep. 6, 2018 for Application No. 17 166 353.7.

* cited by examiner

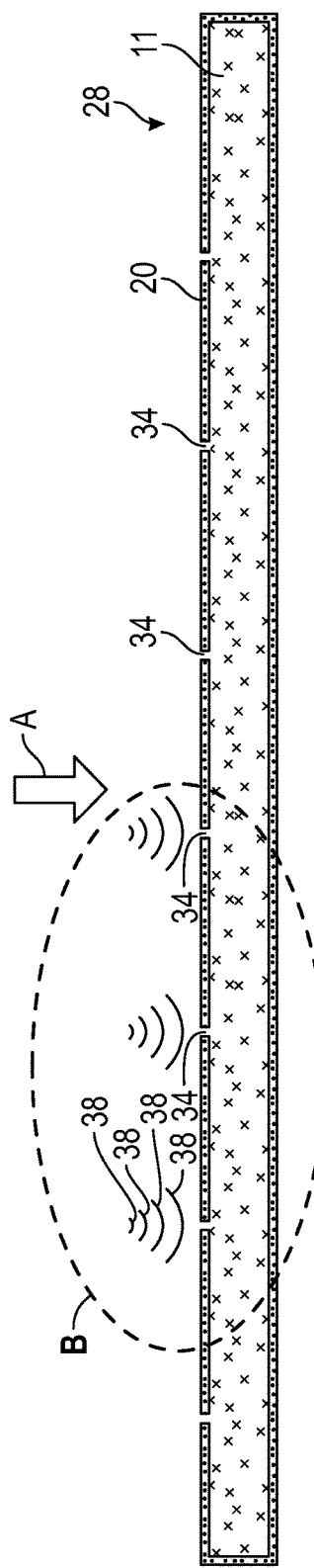
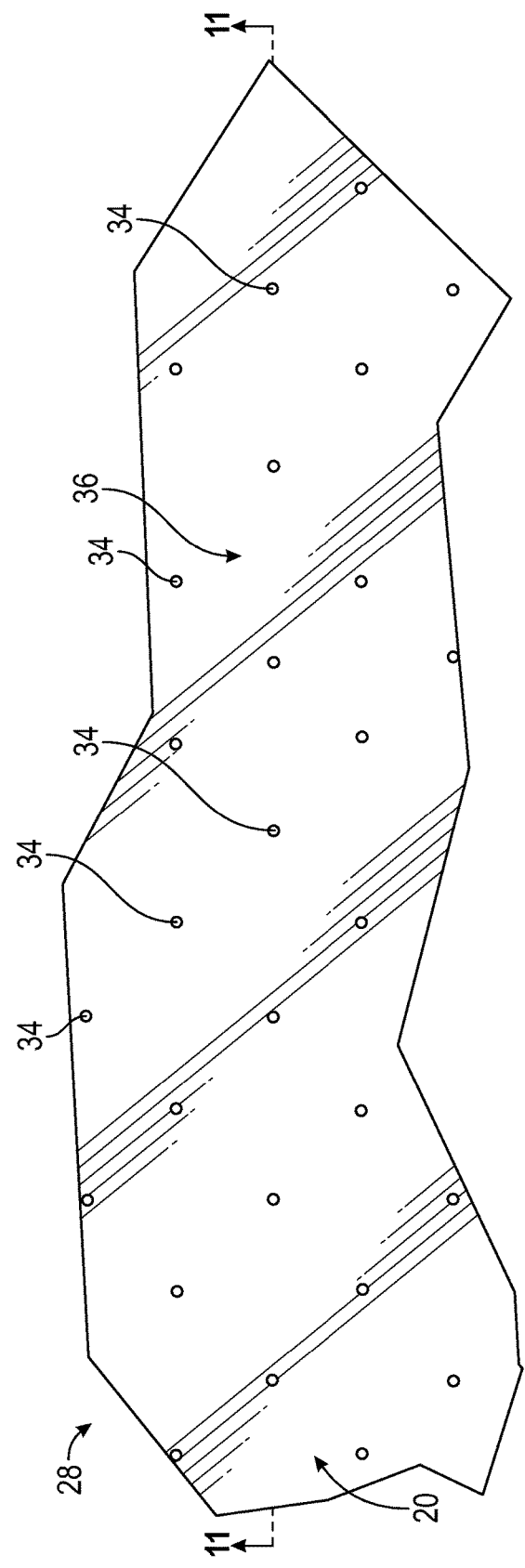
FIG. 11
FIG. 11A

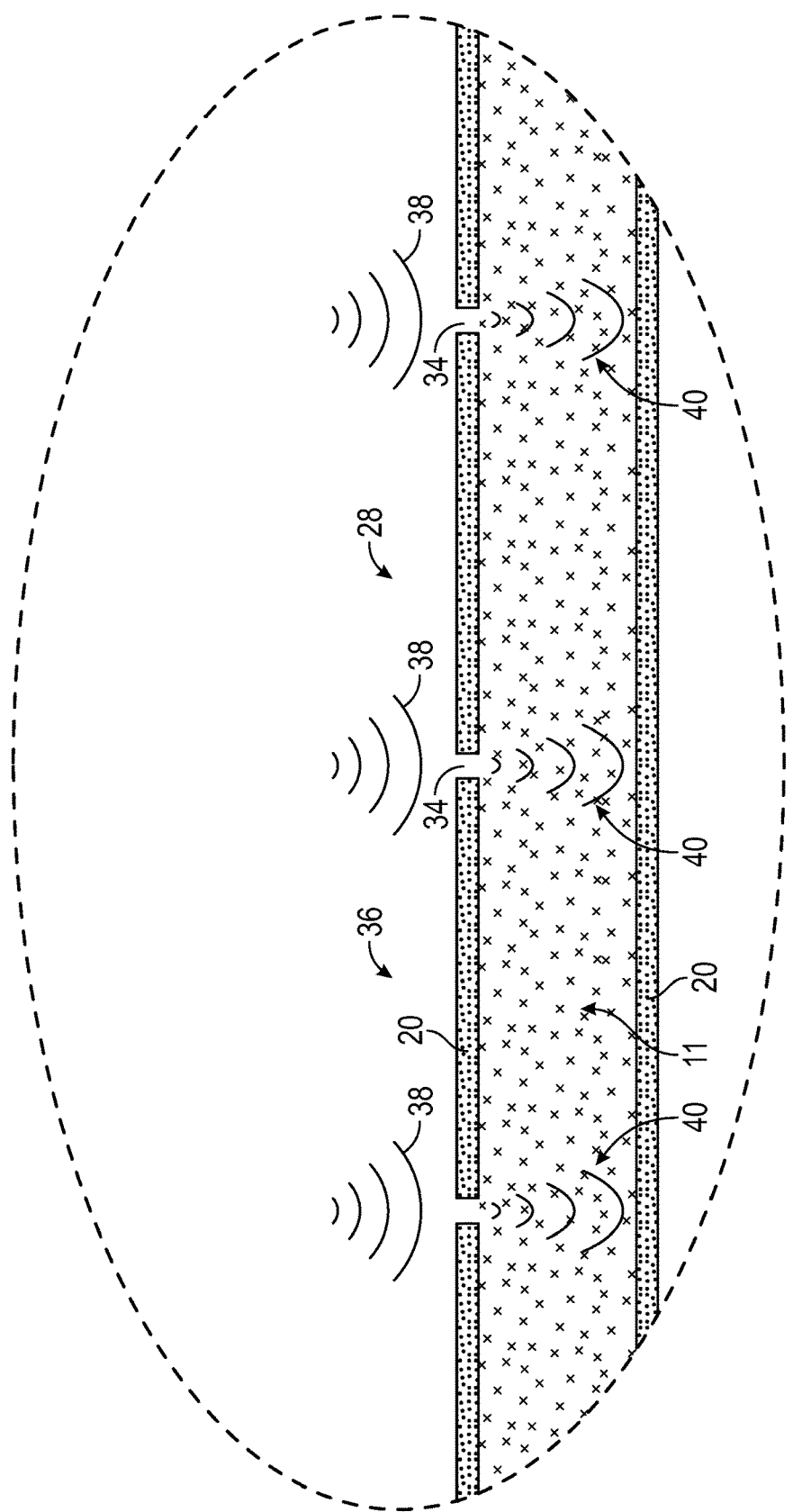

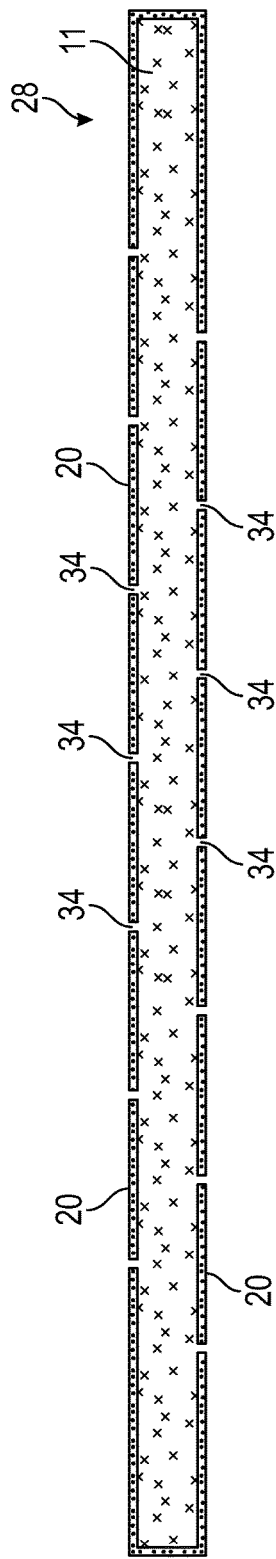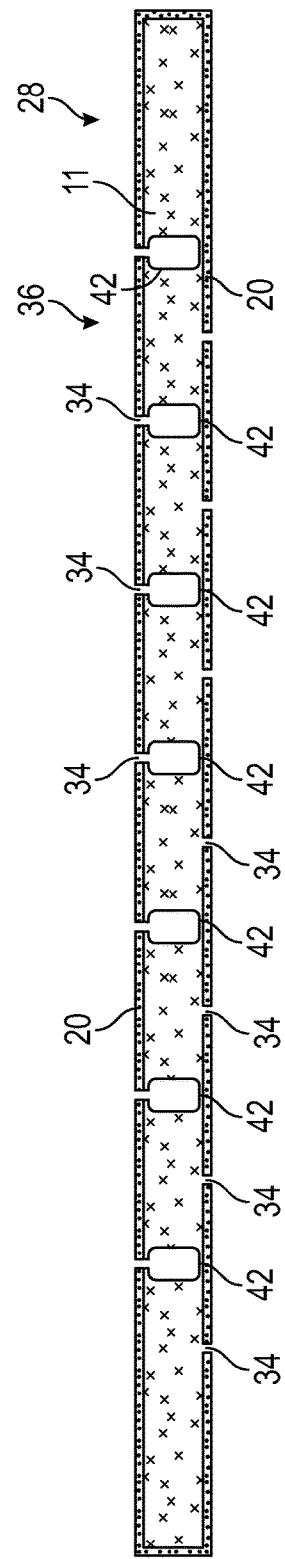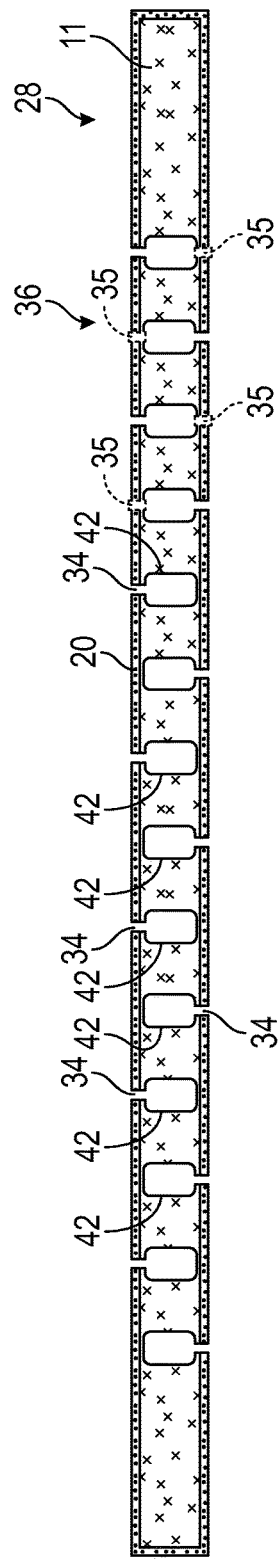

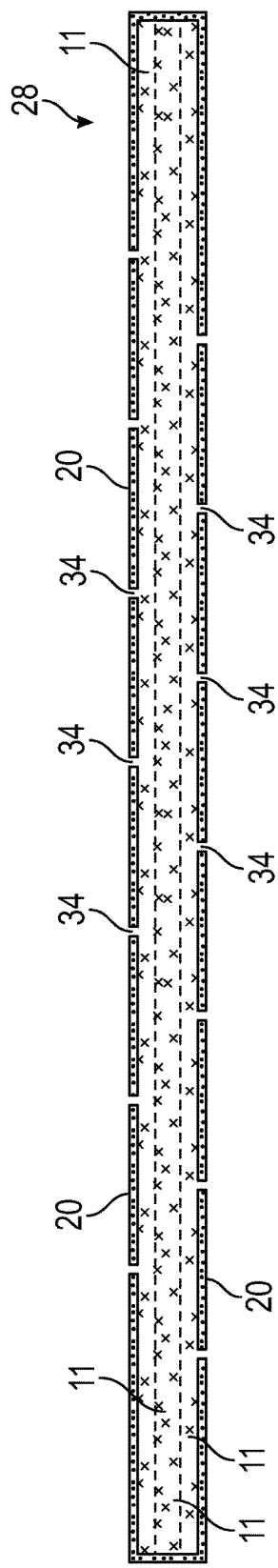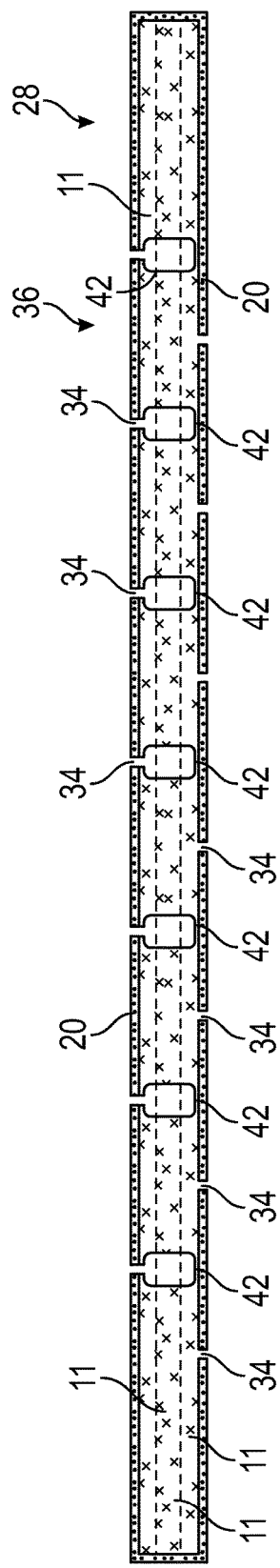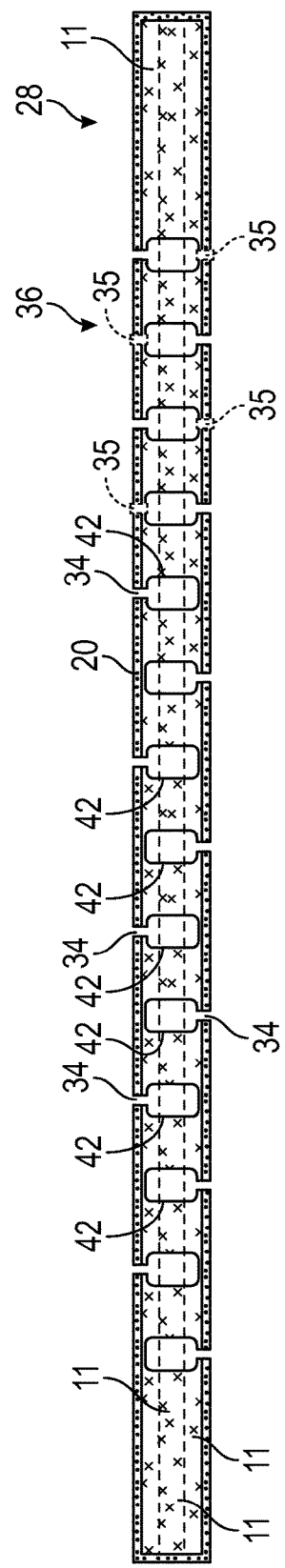

LIGHT WEIGHT COMPONENT WITH ACOUSTIC ATTENUATION AND METHOD OF MAKING

BACKGROUND

This disclosure relates generally to methods of making low-cost, light weight components and components formed by the aforementioned methods. In particular, the present application is directed to a component formed from a composite of metallic foam and an external metallic shell. In addition, various embodiments of the present disclosure are also directed to methods for making such a component.

Commercially suitable components need to meet specific performance criteria. However, while a component may meet certain performance criteria it may be at the cost of other desirable factors such as component weight, time to manufacture and cost to manufacture. For example, subtractive manufacturing or machining oversized blocks, materials or forgings until a desired final part shape is achieved may be one process. However, and in this process, the monolithic nature of the raw input material means that the final part weight is driven by the final volume of the part and density of material used.

Accordingly, it is desirable to provide low-cost, light weight components and components formed by such methods.

BRIEF DESCRIPTION

In one embodiment, a method of making a light weight component is provided. The method including the steps of: forming a metallic foam core into a desired configuration; applying an external metallic shell to an exterior surface of the metallic foam core after it has been formed into the desired configuration; and attenuating the component to a desired frequency by forming a plurality of openings in the external metallic shell.

In addition to one or more of the features described above, or as an alternative to any of the foregoing embodiments, the plurality of openings are only located on a single side of the component.

In addition to one or more of the features described above, or as an alternative to any of the foregoing embodiments, the method further including the step of: forming a plurality of resonant chambers in the metallic foam core prior to the application of the external metallic shell, wherein at least some of the plurality of openings are in fluid communication with a respective one of the plurality of resonant chambers.

In addition to one or more of the features described above, or as an alternative to any of the foregoing embodiments, the plurality of openings are located on opposite sides of the component.

In addition to one or more of the features described above, or as an alternative to any of the foregoing embodiments, the plurality of openings are located on opposite sides of the component.

In addition to one or more of the features described above, or as an alternative to any of the foregoing embodiments, wherein the component is configured for use in a gas turbine engine.

In addition to one or more of the features described above, or as an alternative to any of the foregoing embodiments, wherein the metal of the metallic foam core is selected from the group comprising: titanium; cobalt; aluminum; nickel; steel alloys, magnesium, copper, molybdenum, niobium, tungsten, zinc alloys, titanium aluminide, nickel aluminide and molybdenum disilicide and wherein the attenuating step further comprises determining a diameter of the plurality of openings and a size of the resonant chamber based upon a density of the metallic foam core and a thickness of the component.

In addition to one or more of the features described above, or as an alternative to any of the foregoing embodiments, wherein the metallic foam core is an open cell structure and wherein the metallic foam core comprises a plurality of separate foam cores secured to each other.

In addition to one or more of the features described above, or as an alternative to any of the foregoing embodiments, wherein the metallic foam core is formed into the desired configuration by a machining process selected from the group comprising: milling; electrical discharge machining (EDM); water-jet machining; and laser machining, wherein the desired configuration is slightly smaller than the final dimensions of the light weight component.

In addition to one or more of the features described above, or as an alternative to any of the foregoing embodiments, wherein the metallic foam core is a sheet of metallic foam and the sheet of metallic foam is formed into the desired configuration by a hot or cold forming process wherein the sheet of metallic foam is placed in a die.

In addition to one or more of the features described above, or as an alternative to any of the foregoing embodiments, wherein the metallic foam core is formed into the desired configuration by a machining process selected from the group comprising: milling; grinding; electrical discharge machining (EDM); water-jet machining; and laser machining after the hot or cold forming process.

In addition to one or more of the features described above, or as an alternative to any of the foregoing embodiments, wherein the external metallic shell is deposited on the exterior surface of the metallic foam core via an application process selected from the group comprising: flame spray application process; plasma spray application process; cold-spray application process; electron beam physical vapor deposition (EB/PVD), chemical vapor deposition (CVD); and electroplating application process.

In addition to one or more of the features described above, or as an alternative to any of the foregoing embodiments, wherein the method further includes the step of: heat treating the metallic foam core after the external metallic shell has been applied to the exterior surface of the metallic foam core.

In addition to one or more of the features described above, or as an alternative to any of the foregoing embodiments, wherein the method further includes the step of: forming additional features in the metallic foam core after the external metallic shell has been applied to the exterior surface of the metallic foam core.

In addition to one or more of the features described above, or as an alternative to any of the foregoing embodiments, wherein a thickness of the external metallic outer shell varies in order to provide localized structural rigidity to the component.

In yet another embodiment, a component formed by any of the above methods is provided, wherein the component is a portion of a tailcone of a gas turbine engine.

In still yet another embodiment, a method of making a light weight component is provided. The method including the steps of: forming a metallic foam core into a desired configuration; applying an external metallic shell to an exterior surface of the metallic foam core after it has been formed into the desired configuration, wherein the external metallic shell is selectively applied to vary the thickness of the external metallic shell in order to provide localized structural rigidity to the component; and attenuating the component to a desired frequency by forming a plurality of openings in the external metallic shell.

In addition to one or more of the features described above, or as an alternative to any of the foregoing embodiments, wherein the method further includes the step of forming a plurality of resonant chambers in the metallic foam core prior to the application of the external metallic shell, wherein at least some of the plurality of openings are in fluid communication with a respective one of the plurality of resonant chambers.

In addition to one or more of the features described above, or as an alternative to any of the foregoing embodiments, wherein the plurality of openings are located on opposite sides of the component.

In yet another embodiment, a component is provided. The component including: a metallic foam core having a desired configuration; an external metallic shell applied to an exterior surface of the metallic foam core after it has been placed into the desired configuration, wherein a thickness of the external metallic shell varies in order to provide localized structural rigidity to the component and wherein the metal of the metallic foam core is selected from the group comprising: titanium; cobalt; aluminum; nickel; steel alloys, magnesium, copper, molybdenum, niobium, tungsten, zinc alloys, titanium aluminide, nickel aluminide and molybdenum disilicide; a plurality of resonant chambers located within the metallic foam core; and a plurality of openings extending through a surface of the external metallic shell, wherein a portion of the plurality of openings are in fluid communication with a respective one of the plurality of resonant chambers.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIG. 11 is a cross sectional view of an alternative embodiment of the present disclosure;

FIG. 11A is a view in the direction of arrow "A" in FIG. 11;

FIG. 11B is an enlarged view of the area "B" in FIG. 11;

FIG. 12 is a cross sectional view of yet another alternative embodiment of the present disclosure;

FIG. 13 is a cross sectional view of still yet another alternative embodiment of the present disclosure;

FIG. 14 is a cross sectional view of yet another alternative embodiment of the present disclosure;

FIGS. 12A, 13A and 14A are cross section view of alternative embodiments of the present disclosure;

DETAILED DESCRIPTION

Various embodiments of the present disclosure are related to methods of making low cost, light weight components and components formed by the aforementioned methods. In particular, the present application is directed to a component having an internal foam core, which in one embodiment may be a metallic foam core or alternatively a non-metallic foam core such as a ceramic foam core or any other non-metallic foam core and an external metallic shell surrounding the metallic or non-metallic foam core and methods for making such a component.

The present disclosure is directed to a method of making a component using a combination of subtractive and additive manufacturing processes. In general, the method starts with a metallic foam core using alloy and foam density that is compatible with a specific design application. As mentioned above and in alternative embodiments, the foam core may be non-metallic. The metallic foam core is then machined or formed to a shaped pre-form for subsequent manufacturing steps. After the metallic foam core is formed to the desired shape, a metallic skin is applied to the external surface of the metallic foam core creating a light-weight, rigid structure which can have characteristics similar to existing non-metallic foam core or metallic or non-metallic honeycomb components. After the metallic skin is applied a final machining of the component may occur wherein dimensional characteristics and/or features are added to the component.

Figure 1:
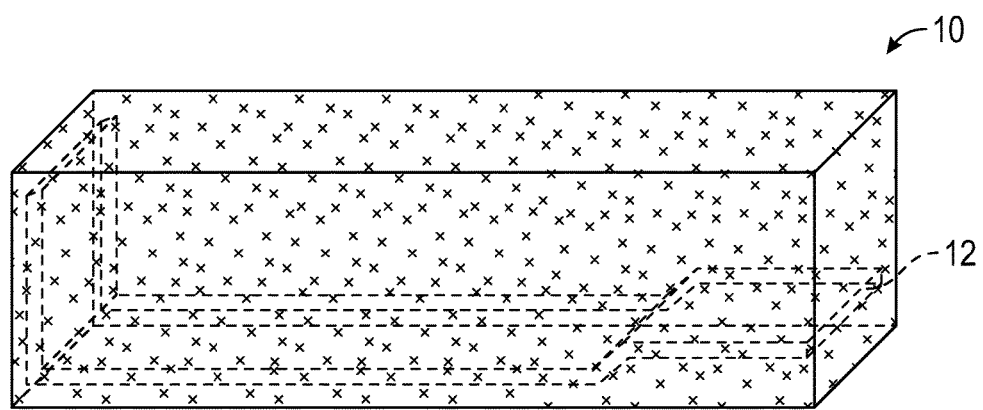
FIG. 1 is a perspective view of an un-machined block of metallic foam.

Referring now to FIG. 1, an unformed block of metallic foam 10 is illustrated. The block of metallic foam 10 may be formed from any suitable metal either commercially pure or alloy including but not limited to anyone of the following: titanium (including Ti 6-4, Ti 6-2-4-2, beta phase alloys including Beta 21s), cobalt, aluminum, nickel (including Inconel 625, Inconel 718), steel alloy, magnesium, copper, molybdenum, niobium, tungsten and zinc alloys as well as intermetallic alloys including titanium aluminide, nickel aluminide and molybdenum disilicide and equivalents thereof. In general, a metallic foam may be referred to as a cellular structure comprising a solid metal with a large volume fraction of pores. These pores may be sealed (closed-cell foam) or interconnected (open-cell foam). In one non-limiting embodiment, the porosity of the foam may be within the range of 5% to 80%. Of course, ranges of porosity greater or less than the aforementioned range are considered to be with the scope of various embodiments of the present disclosure. Selection of the porosity of the metallic foam may be dependent upon the ultimate end use of the component to be formed. For example and in some applications, it may be desirable to have a more porous foam core or a less porous foam core. The metallic foam block 10 is large enough to contain a desired part or component geometry 12 illustrated by the dashed lines 12 in FIG. 1.

Figure 2:
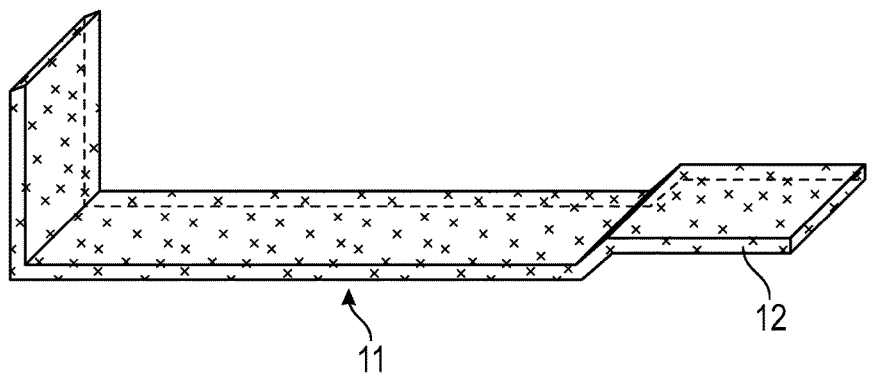
FIG. 2 is a perspective view of a machined block of metallic foam.

In FIG. 2, the block of metallic foam 10 has been machined into a foam core 11 having the desired interim part or interim component geometry 12 via any suitable process. As used herein interim part or interim component geometry may be referred to as being slightly smaller than the final part or component geometry in order to account for the applied external metallic shell 20. In some applications, it may be desirable to form the metallic foam core to near net shape as part of the initial foam manufacturing process. Examples of machining processes include but are not limited to milling, grinding, electrical discharge machining (EDM), water-jet machining, laser machining, combinations thereof or any other process capable of machining the block 10 into the metallic foam core 11 having the component geometry 12.

Figure 3:
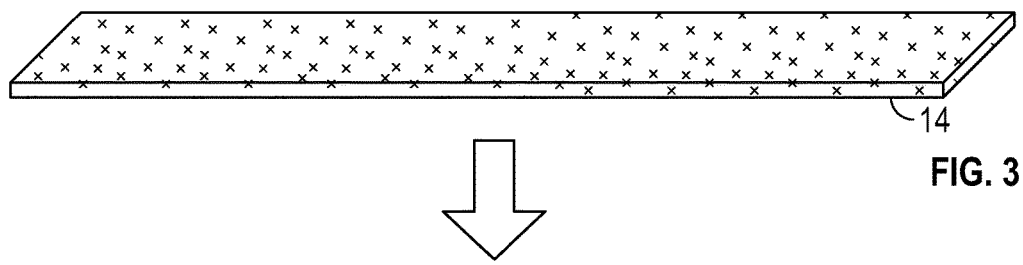
FIG. 3 is a perspective view of an un-formed sheet of metallic foam.
Figure 3A:
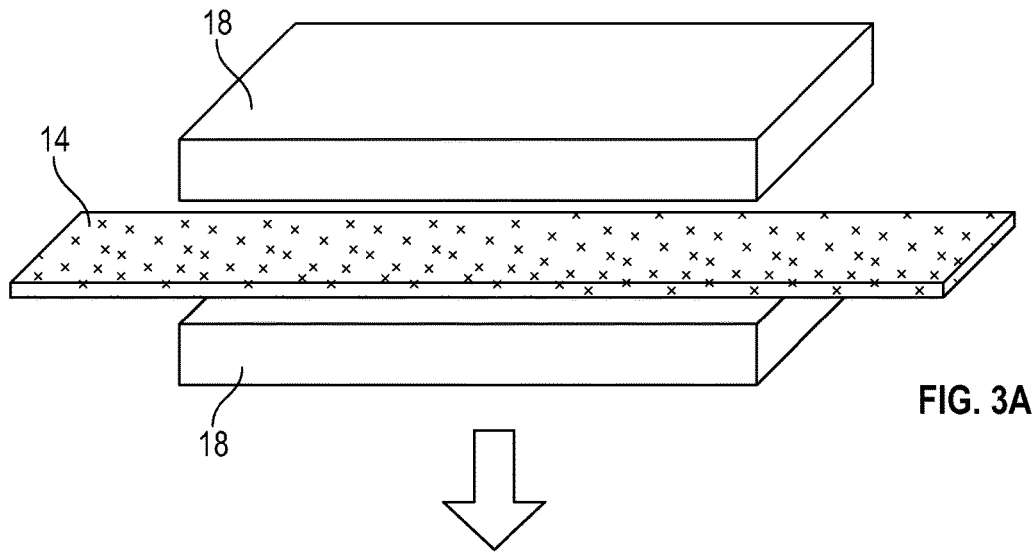
FIG. 3A is a perspective view of the un-formed sheet of metallic foam placed in a die for forming the un-formed sheet of metallic foam.
Figure 4:
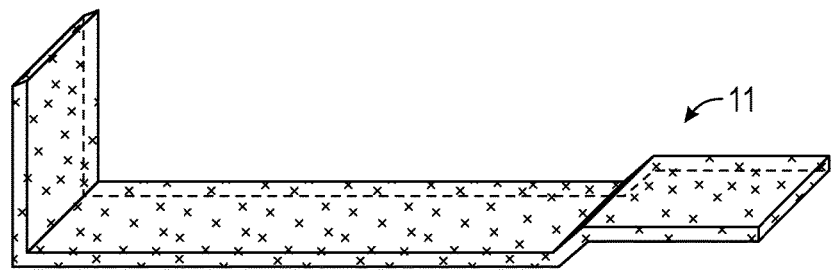
FIG. 4 is a perspective view of a formed sheet of metallic foam.

Alternatively and as illustrated in FIGS. 3, 3A and 4, a sheet of metallic foam 14 may be provided. In this alternative process, the sheet of metallic foam 14 is formed into the foam core 11 having the desired part or component geometry 12 via a hot or cold forming process wherein the sheet of metallic foam 14 is placed in a die 16. The die 16 may include a pair of complementary halves 18 configured to form the desired part or component geometry 12. In alternative embodiments, the die 16 may have more than one pair of elements or die halves 18.

The formed component or metallic core 11 is illustrated in FIG. 4. The formed sheet of metallic foam may be further shaped to a final configuration using the aforementioned machining processes such as milling, electrical discharge machining (EDM), water-jet machining, laser machining, combinations thereof or any other process capable of machining the formed sheet of metallic foam.

Figure 5:
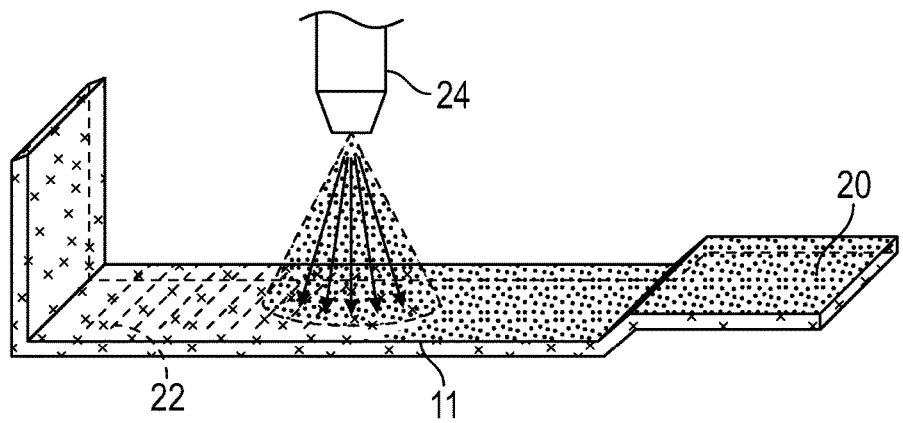
FIG. 5 illustrates the application of an external metallic shell to the formed or machined metallic foam of FIG. 2 or 4.

Referring now to at least FIG. 5, the formed metallic foam core 11 from any of the aforementioned processes (machining, forming or combinations thereof) depicted in at least FIGS. 1-4, has an external metallic shell 20 deposited on the exterior surface of the formed metallic foam core 11. In one embodiment, the external metallic shell 20 is deposited about the entire exterior surface of the formed metallic foam core 11. Alternatively, discrete areas of the formed metallic foam core may be masked such that the external metallic shell 20 is prohibited from covering certain areas. The external metallic shell 20 may also be referred to as an outer reinforcing metallic skin 20. Accordingly, the metallic foam pre-form or core 11 is used as a base for application of the external metallic shell 20. Depending on the initial foam cell size and material being deposited as well as the deposition method, it may be permissible to have an interim coat or applique to form a non-porous intermediate layer for metallic deposition. In this embodiment, the interim coat is first applied and then the external metallic shell 20 is applied to the metallic foam pre-form or core 11. In FIG. 5, the interim coat is illustrated by the dashed lines 22. The external metallic shell 20 is a metallic material chemically and metalurgically compatible with that of the metallic foam and the external metallic outer shell 20 may be applied via any suitable methods including but not limited to the following application processes: flame spray application; plasma spray application; cold-spray application; electron beam physical vapor deposition (EB/PVD), chemical vapor deposition (CVD), electroplating, additive manufacturing (including but not limited to electron beam melt, direct metal later sintering, free-form laser deposition, etc.) or any other suitable means. The external metallic outer skin can be made of any of the same alloys listed in the core section which includes but is not limited to titanium (including Ti 6-4, Ti 6-2-4-2, beta phase alloys including Beta 21s), cobalt, aluminum, nickel (including Inconel 625, Inconel 718), steel alloy, magnesium, copper, molybdenum, niobium, tungsten and zinc alloys as well as intermetallic alloys including titanium aluminide, nickel aluminide and molybdenum disilicide and equivalents thereof. The material used in the external metallic outer skin may be the same or may be different than that used in the foam core depending on the metallurgical compatibility of the outer skin to the foam core. In addition and in some instances when a different alloys is used for the external skin 20 as opposed to that used for the foam core, one or more intermediate alloys may be used as interim coat or coats 22 covering portions or all of the part to bridge the compatibility of the core alloy 11 and the outermost skin alloy 20.

Other non-metallic materials may be deposited in place of or in addition to the metallic coatings, these coatings may include ceramic based thermal barrier coatings.

Figure 6:
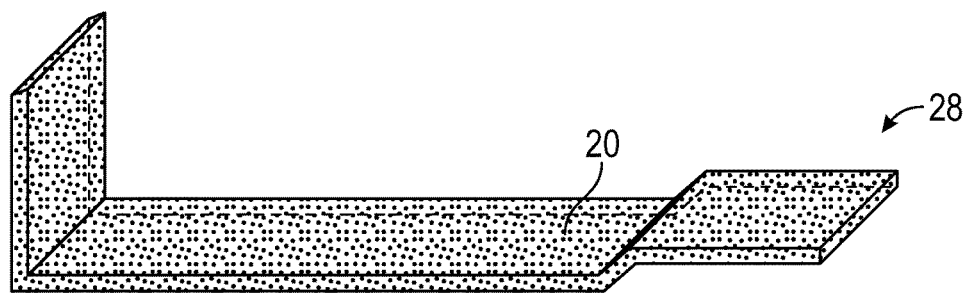
FIG. 6 illustrates the formed or machined metallic foam of FIG. 2 or 4 with an applied external metallic shell.

In FIG. 5, a nozzle 24 is illustrated and in one embodiment, the nozzle 24 may be used in conjunction with a plasma spray application process. Once the external metallic outer shell 20 is applied to the exterior surface of the metallic foam pre-form or core 11, this part, as illustrated in FIG. 6, is inspected for surface coverage and may be further subjected to a heat treating step in order to relieve residuals stresses imparted by manufacturing and outer skin deposition processes and/or to provide desired final material properties. In applications where the foam core is an open cell structure, the outer skin may be perforated with a plurality of venting holes to allow for internal air to escape from the part as it is heated during the heat treating step. In one embodiment, the venting holes may be sealed after the heat treating step and in other embodiments, the venting holes may be subsequently sealed after the heat treating step.

Figure 7:
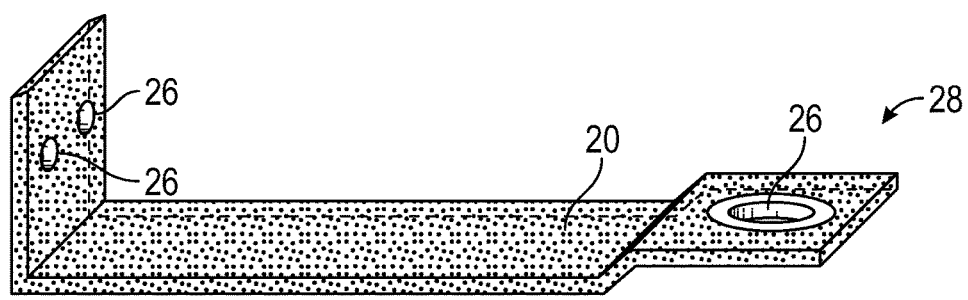
FIG. 7 illustrates the formed or machined metallic foam of FIG. 6 with additional features formed therein.

At the next step, additional features 26 are introduced to the coated metallic foam pre-form or core 11 in order to form the desired part or component 28. These additional features may be added by any suitable process such as milling, spot-face drilling, counter-bore drilling, conventional drilling, etc. In FIG. 7, the features 26 are illustrated as openings, of course, any other configurations are considered to be within the scope of various embodiments of the present disclosure. Still further and in the event that the drilling process removes some of the external metallic outer shell 20 and the metallic foam is exposed, a supplemental application process of the external metallic outer shell 20 may be employed to cover the exposed metallic foam. In yet another embodiment, the part 28 may not require any additional features 26 to be added. In one non-limiting embodiment, the component 28 may comprise the formed metallic core 11, an applied external metallic shell 20 and if applicable feature 26 as well as an intermediary layer 22 located between an external surface of the formed metallic core 11 and the applied external metallic shell 20.

Since the external metallic outer shell 20 is applied via a process wherein the localized thickness of the external metallic outer shell 20 may vary with respect to other locations, the thickness of the external metallic outer shell 20 on the exterior of the part may be tailored in thickness, pattern and orientation to provide preferential strength and thus the part or component 28 may have localized structural features such as ribs or gussets, which are provided by the applied external metallic outer shell 20.

Figure 8:
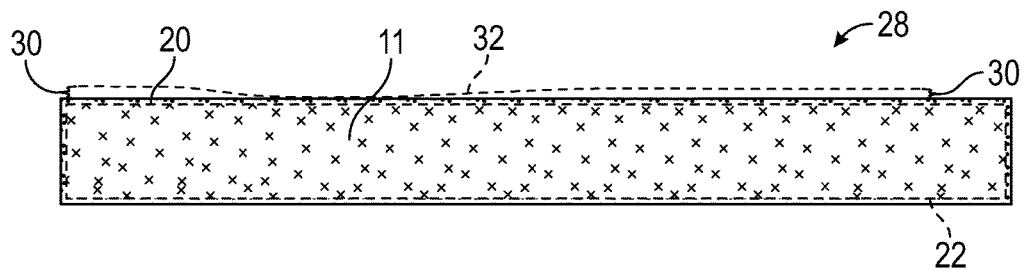
FIG. 8 is a cross-sectional view of a portion of the formed or machined metallic foam of FIG. 6 or 7.
Figure 8A:
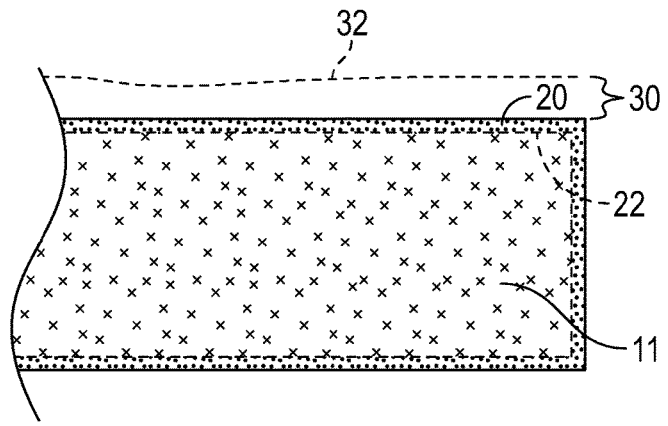
FIG. 8A is an enlarged cross-sectional view of a portion of the formed or machined metallic foam of FIG. 6 or 7.

For example and referring at least to the cross-sectional view of FIGS. 8 and 8A, a thickness 30 of the external metallic outer shell 20 may vary. In FIG. 8, the dashed line 32 is provided to illustrate the varying thickness of the external metallic outer shell 20 that surrounds the internal metallic foam core 11. Also shown in FIGS. 8 and 8A is the intermediary layer 22, which may or may not be applied prior to the application of the external metallic outer shell 20.

In yet another implementation and for parts designed to be capable of bending in certain areas over others, the applied metallic skin on the external surface of the formed part in some applications places the load carrying material away from a neutral axis of the part for high structural efficiency.

In accordance with various embodiments of the present disclosure, machining or forming of the metallic foam core 11 can be done very quickly and at lower expense than machining a solid block of material. This will result in a significant reduction in raw material waste vs. machining processes applied to solid blocks of material. In addition, the metallic deposition on the outside of foam core may be tailored in thickness to provide preferential strength.

Figures 9, 10:
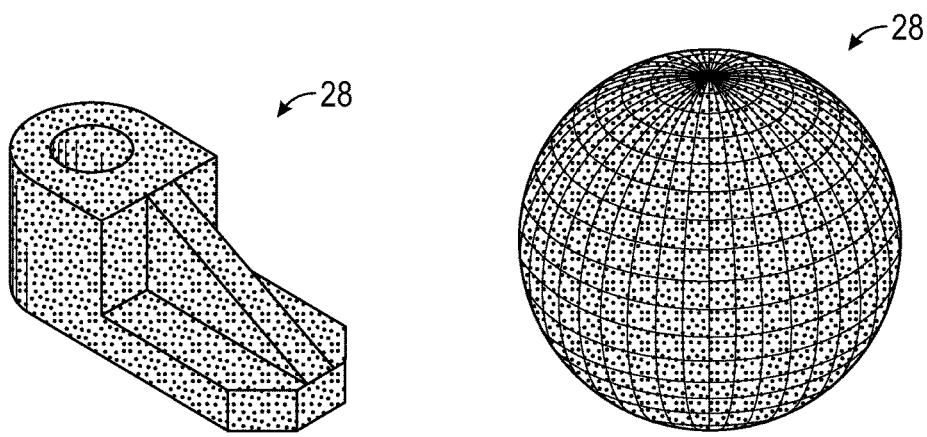
FIGS. 9 and 10 are non-limiting examples of components formed by the methods of the present disclosure.

FIGS. 9 and 10 illustrate non-limiting examples of a part or component 28 formed by the various methods of the present disclosure. Some additional non-limiting examples of contemplated components or parts include brackets, housings, ducts, liner assemblies, (commercial engine tailcones, nozzles, etc). In one non-limiting embodiment, the part or component 28 may be an aviation component. In another embodiment, the component may be used in any application where the component weight and cost are key design constraints.

Referring now to FIGS. 11-11B, an alternative embodiment of the present disclosure is illustrated. In this embodiment, the formed part or component 28 after application of the external metallic outer shell 20 has a plurality of holes or openings 34 formed through the external metallic outer shell 20. The plurality of holes or openings 34 are arranged as an array or a feature 36 on the component that creates an acoustic impedance to sound waves. For example, the component 28 with its array 36 of openings 34 may be tuned to discrete desired frequencies such that the component 28 may be used not only as a structural component but a structural component with acoustic attenuation.

One contemplated use for component 28 is that in the field of gas turbine engines. Gas turbine engines generate complex flow fields resulting from chemical combustion and aerodynamic interaction. For commercial products where maximum acoustic signature is governed by regulatory requirements and competitive factors, it is often desirable to integrate features that help attenuate noise. Thus, a component 28 configured for use areas of the engine to address fan, turbine and other noise sources may be desirable. For example, component 28 may be a wall member or portion configured to have an array of holes designed and impedance tuned for specific frequencies of acoustic energy.

Still further and in view of the formability of the metallic foam core 11 these acoustic features can be incorporated into components having complex shapes that typically cannot be efficiently produced with prior construction methods or those that do not use a pre-formed metallic foam core 11 with an external metallic outer shell 20. In FIGS. 11 and 11A, the holes 34 of the array of holes 36 are located on a single surface of the component 28. As such, the acoustic energy represented by waves 38 in FIG. 11 can be absorbed by the component 28 or its internal metallic foam core 11 due to its open cell structure. As mentioned above, the hole or opening 34 size and the configuration of the array 36 may be dependent upon the desired impedance for a particular acoustic energy. Thus, the formed component may be designed or tuned to a desired frequency the component 28 is configured to encounter. This tuning may be a combination of the density and/or composition of the metallic foam core 11, the thickness of the external metallic outer shell 20, the location, size and arrangement of the holes or openings 34 in the external metallic outer shell 20.

Referring now to FIG. 11B an enlarged portion of the component 28 is illustrated. As illustrated, the acoustic energy illustrated by lines 38 passes through openings 34 and interacts with the metallic foam medium (e.g., metallic foam core 11). As mentioned above, the cell size of the metallic core can be tailored depending upon the acoustic and structural properties desired for component 28. As mentioned above and in one implementation, the acoustic energy may be generated due to thermo-acoustic instabilities associated with the combustion and a gas turbine engine and the openings or holes 34 and the configuration of array 36 provides and impedance to this acoustic energy. In other words, the component 28 is tuned to one or more specified frequencies through section of one or more hole 34 diameters alone or in combination with other dimensional characteristics and foam density for component 28. The transmitted acoustic energy that interacts with the metallic foam media is illustrated by the lines 40 in FIG. 11B.

In FIG. 12 a cross-sectional view of an alternative embodiment of the present disclosure is illustrated. In this embodiment as opposed to the embodiment of FIGS. 11-11B, the array 36 and its openings 34 are located on both sides of a component 28 as opposed to being only located on a single side or face of the component 28. In FIG. 13 yet another alternative embodiment is illustrated, in this embodiment the metallic foam core 11 is configured to have a plurality of internal resonant chambers 42 located within the component 28 and defined in the metallic foam core 11. In this embodiment, the resonant chambers 42 provide an enlarged cavity within the metallic foam core 11 that is in fluid communication with the exterior of the component 28 via an associated opening 34. As illustrated, the plurality of internal resonant chambers 42 are in fluid communication with the plurality of openings 34 thereby providing a secondary mechanism for acoustic attenuation. Acoustic energy frequency tuning can be accomplished through the selection of one or more hole 34 diameters and sizing of chamber 42 in combination with foam density and thickness or dimensional characteristics of component 28. It should be noted that sizing of chamber 42 refers to both dimensional and shape characteristics of the chamber to provide optimum attenuation performance. In order to generate the desired internal chamber 42 dimension and shape, the metallic foam core 11 may be constructed of single element or a stack of multiple foam core 11 elements. See at least FIGS. 12A, 13A and 14A wherein the multiple layers of cores 11 are separated by the dashed lines. If multiple layers are utilized, bonding of the stack may be completed using additional processes including brazing, welding and physical bonding using rivets or other means of mechanical joining. Alternatively, the application of the outer surface 20 may be adequate to encapsulate the stack. As illustrated in the embodiment of FIGS. 13 and 13A, the plurality of internal resonant chambers 42 are only in fluid communication with openings 34 located on a single side or single face of the component 28. Also shown in FIGS. 13 and 13A is that an optional second array 36 with a second plurality of openings 34 may be located on an opposite side of the component 28 however the second array 36 and second plurality of openings 34 are simply in fluid communication with the metallic foam core 11 and are not in fluid communication with a resonant chamber 42.

Referring now to FIGS. 14 and 14A, yet another alternative embodiment is illustrated. In this embodiment, the openings 34 and associated arrays are located on opposite sides of the component 28 and each of the plurality of openings 34 is in fluid communication with an associated resonant chamber 42 located within the metallic foam core 11. In yet another alternative embodiment and as illustrated in FIGS. 14 and 14A, a second opening or hole 35 is provided wherein the hole 34 enters the resonant chamber 42 on one side and exits the same chamber via the second hole 35 on the opposite surface. As illustrated, some of the chambers 42 may be provided with both holes or openings 34, 35 or all of the chambers may be provided with holes or openings 34, 35.

It is, of course, understood that the openings 34 and if applicable 35 in the external metallic outer shell 20 may be formed by any of the aforementioned processes such as milling, spot-face drilling, counter-bore drilling, and conventional drilling, etc. In addition, the internal resonant chambers 42 of the metallic foam core 11 they also be formed therein by any suitable process including but not limited to the following: milling, electrical discharge machining (EDM), water-jet machining, laser machining, combinations thereof or any other process capable of machining the metallic foam core 11 into the desired configuration.

Figures 15, 16:
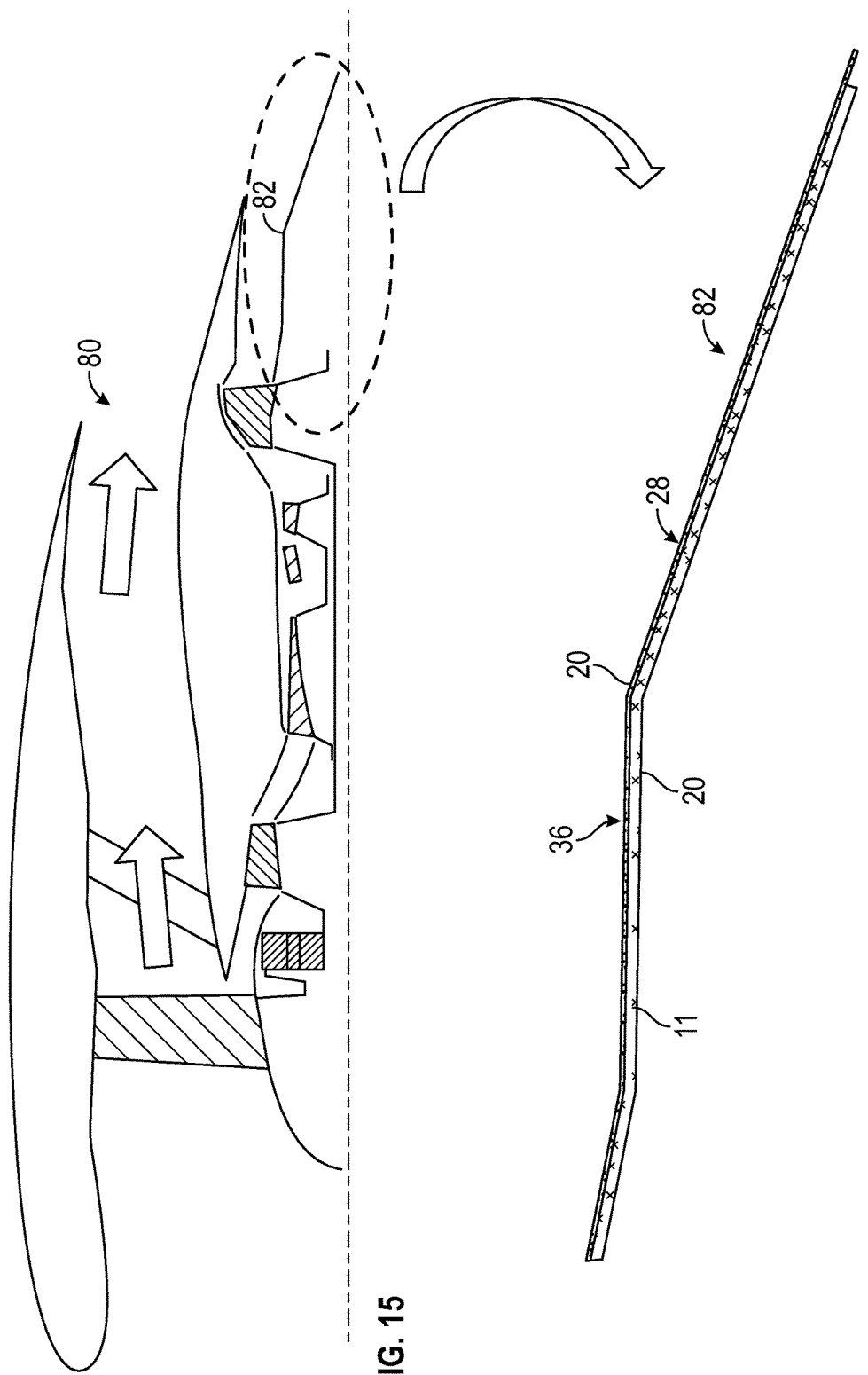
FIG. 15 is a cross sectional view of a portion of a gas turbine engine.
FIG. 16 is an enlarged view of portion of the gas turbine engine illustrated in FIG. 15.

Referring now to FIGS. 15 and 16, a portion of a gas turbine engine 80 is illustrated, wherein the component 28 is a portion of a tailcone 82 of the engine 80.

Figure 17:
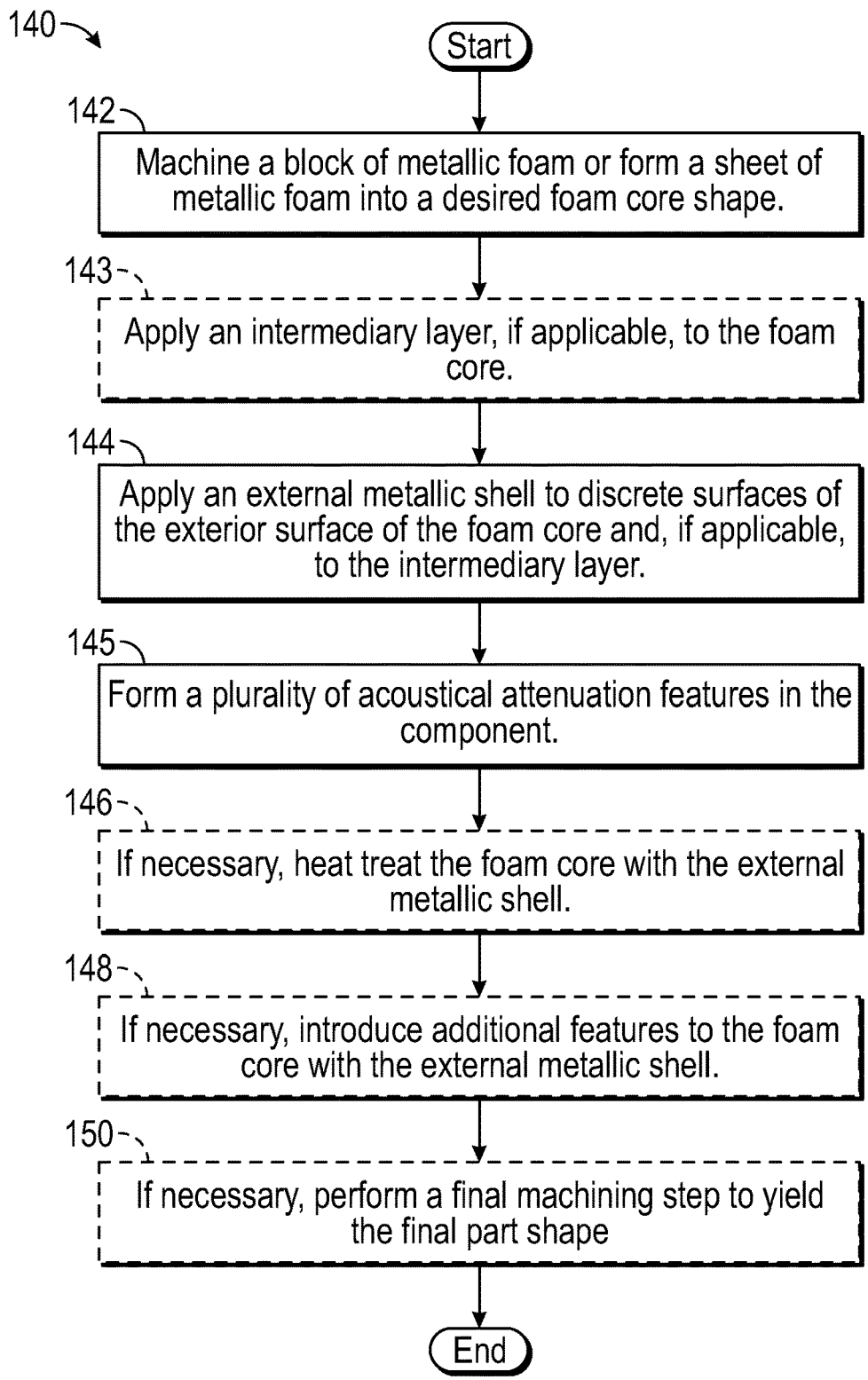
FIG. 17 is a flow chart illustrating a method of making a component according to non-limiting methods of the present disclosure.

Referring now to FIG. 17 a flow chart 140 illustrating a method for forming a part or component 28 in accordance with various embodiments of the present disclosure is illustrated. At a first step 142, an unformed block of metallic foam 10 is machined to foam core 11. As mentioned above non-limiting machining processes include milling, electrical discharge machining (EDM), water-jet machining, laser machining, combinations thereof or any other process capable of machining the block 10 into the metallic foam core 11 having the component geometry 12. Alternatively and at the first step 142, a sheet of metallic foam 14 may be provided and the sheet of metallic foam 14 is formed into the foam core 11 having the desired part or component geometry 12 via a hot or cold forming process wherein the sheet of metallic foam 14 is placed into a die 16. The die 16 may include a pair of complementary halves 18 configured to form the desired part or component geometry 12. The formed sheet of metallic foam may be further shaped to a final configuration using the aforementioned machining processes.

Thereafter and at step 144, the formed component or metallic core 11 from any of the aforementioned processes (machining, forming or combinations thereof) has an external metallic shell 20 deposited on the exterior surface of the formed metallic foam core 11. As a precursor to step 144, an interim coat or applique may be applied to the foam core 11 prior to the application of the external metallic shell 20. This is illustrated as alternative step 143, which is illustrated in dashed lines. As mentioned above, the external metallic outer shell 20 may be applied via any one of the aforementioned processes including but not limited to: flame spray application; plasma spray application; cold-spray application; electron beam physical vapor deposition (EB/PVD), chemical vapor deposition (CVD), electroplating, additive manufacturing (including but not limited to electron beam melt, etc.) or any other suitable means.

Thereafter and at step 145, a plurality of acoustical attenuation features are formed in the component 28. As mentioned above, these acoustical attenuation features may comprise an array 36 of openings 34 located on a single side or multiple sides of the component 28 and in some embodiments may also be fluidly coupled to resonant chambers 42 formed in the metallic foam core prior to the application of the external metallic shell at step 144. For example, the resonant chambers 42 may be formed in the metallic foam during step 142.

Once the acoustical attenuation features are applied to the exterior surface of the metallic foam pre-form or core 11 at step 145, this part, may be further subjected to a heat treating step 146, which is illustrated in dashed lines as this step may not be required in all processes. Alternatively, the acoustical attenuation features may be formed in the component 28 prior to the heat treatment step.

At step 148, additional features 26, if required, are introduced to the coated metallic foam pre-form or core 11 in order to form the desired part or component 28. These additional features may be added by any suitable process such as milling, spot-face drilling, counter-bore drilling, conventional drilling, etc. Still further and in the event that the drilling process removes some of the external metallic outer shell 20 and the metallic foam is exposed, a supplemental application process of the external metallic outer shell 20 may be employed to cover the exposed metallic foam. In yet another embodiment, the part 28 may not require any additional features 26 to be added. In addition and as illustrated by the dashed lines in FIG. 15, an alternative step 150 may be provided wherein a final machining step of any key attachment, interface or functionally critical surfaces of the part or component occurs after step 148. This would yield the final part shape.

It being understood that in alternative embodiments where the component or part 28 does not require acoustical attenuation features for example, the embodiments of FIGS. 1-10, step 145 may be viewed as an optional step in the flow chart 140.

As discussed herein various methods for producing light weight, low-cost components and/or part are provided. Still further components and/or parts formed by the various methods are also provided. In addition, various embodiments, contemplate components formed by the processes disclosed herein, wherein the formed component has integral acoustic attenuating characteristics. As described herein acoustic attenuation is created by drilling (mechanical, laser, EDM, waterjet, etc.) holes or other desired perforations into the flowpath surface of the component.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method of making a light weight component, comprising:
forming a metallic foam core into a first configuration;
applying an external metallic shell to an exterior surface of the metallic foam core after it has been formed into the first configuration via a spray application process; and
attenuating the component to a frequency by forming a plurality of openings in the external metallic shell.

2. The method as in claim 1, wherein the plurality of openings are only located on a single side of the component.

3. The method as in claim 1, further comprising forming a plurality of resonant chambers in the metallic foam core prior to the application of the external metallic shell, wherein at least some of the plurality of openings are in fluid communication with a respective one of the plurality of resonant chambers.

4. The method as in claim 3, wherein the plurality of openings are located on opposite sides of the component.

5. The method as in claim 3, wherein the metal of the metallic foam core is selected from the group comprising: titanium; cobalt; aluminum; nickel; steel alloys, magnesium, copper, molybdenum, niobium, tungsten, zinc alloys, titanium aluminide, nickel aluminide and molybdenum disilicide and wherein the attenuating step further comprises modifying a diameter of the plurality of openings and a size of the resonant chamber based upon a density of the metallic foam core and a thickness of the component.

6. The method as in claim 1, wherein the plurality of openings are located on opposite sides of the component.

7. The method as in claim 1, wherein the component is configured for use in a gas turbine engine.

8. The method as in claim 1, wherein the metallic foam core is an open cell structure and wherein the metallic foam core comprises a plurality of separate foam cores secured to each other.

9. The method as in claim 1, wherein the metallic foam core is formed into the first configuration by a machining process selected from the group comprising: milling; electrical discharge machining (EDM); water jet machining; and laser machining, wherein the first configuration is smaller than the final dimensions of the light weight component.

10. The method as in claim 1, wherein the metallic foam core is a sheet of metallic foam and the sheet of metallic foam is formed into the first configuration by a hot or cold forming process wherein the sheet of metallic foam is placed in a die.

11. The method as in claim 10, wherein the metallic foam core is formed into the first configuration by a machining process selected from the group comprising: milling; grinding; electrical discharge machining (EDM);
water-jet machining; and laser machining after the hot or cold forming process.

12. The method as in claim 1, wherein the spray application process is selected from the group comprising: flame spray application process; plasma spray application process; and cold-spray application process.

13. The method as in claim 1, further comprising the step of: forming additional features in the metallic foam core after the external metallic shell has been applied to the exterior surface of the metallic foam core.

14. The method as in claim 1, wherein a thickness of the external metallic outer shell varies in order to provide localized structural rigidity to the component.

15. A component formed by the method of claim 1, wherein the component is a portion of a tailcone of a gas turbine engine.

16. A method of making a light weight component, comprising:
forming a metallic foam core into a first configuration;
applying an external metallic shell to an exterior surface of the metallic foam core after it has been formed into the first configuration
heat treating the metallic foam core after the external metallic shell has been applied to the exterior surface of the metallic foam core; and
attenuating the component to a frequency by forming a plurality of openings in the external metallic shell.

17. The method as in claim 16, wherein the external metallic shell is selectively applied to vary the thickness of the external metallic shell in order to provide localized structural rigidity to the component.

18. The method as in claim 17, further comprising forming a plurality of resonant chambers in the metallic foam core prior to the application of the external metallic shell, wherein at least some of the plurality of openings are in fluid communication with a respective one of the plurality of resonant chambers and wherein the external metallic shell is deposited on the exterior surface of the metallic foam core via an application process selected from the group comprising: flame spray application process; plasma spray application process; cold-spray application process; electron beam physical vapor deposition (EB/PVD), chemical vapor deposition (CVD); and electroplating application process.

19. The method as in claim 18, wherein the plurality of openings are located on opposite sides of the component.

20. A component, comprising:
a metallic foam core having a first configuration, wherein the metallic foam core is an open cell structure and wherein the metallic foam core comprises a plurality of separate foam cores secured to each other;
an external metallic shell applied to an exterior surface of the metallic foam core after it has been placed into the first configuration, wherein a thickness of the external metallic shell varies in order to provide localized structural rigidity to the component;
a plurality of resonant chambers located within the metallic foam core; and
a plurality of openings extending through a surface of the external metallic shell, wherein a portion of the plurality of openings are in fluid communication with a respective one of the plurality of resonant chambers.

* * * * *